(12) United States Patent
Tang et al.

(10) Patent No.: US 6,376,380 B1
(45) Date of Patent: Apr. 23, 2002

(54) METHOD OF FORMING MEMORY CIRCUITRY AND METHOD OF FORMING MEMORY CIRCUITRY COMPRISING A BURIED BIT LINE ARRAY OF MEMORY CELLS

(75) Inventors: Sanh D. Tang; Raj Narasimhan, both of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 34 days.

(21) Appl. No.: 09/652,601

(22) Filed: Aug. 30, 2000

(51) Int. Cl.$^7$ .................................................. H01L 21/00
(52) U.S. Cl. ..................... 438/692; 438/745; 438/753; 438/756
(58) Field of Search .................... 438/691, 692, 438/693, 719, 723, 745, 753, 756; 216/38, 88, 89, 99; 156/345 LP

(56) References Cited

U.S. PATENT DOCUMENTS

| | | | |
|---|---|---|---|
| 4,987,099 A | 1/1991 | Flanner | 437/192 |
| 5,023,683 A | 6/1991 | Yamada | 357/23.6 |
| 5,032,882 A | 7/1991 | Okumura et al. | 357/23.6 |
| 5,061,650 A | 10/1991 | Dennison et al. | 437/47 |
| 5,084,414 A | 1/1992 | Manley et al. | 437/189 |
| 5,087,591 A | 2/1992 | Teng | 437/225 |
| 5,120,679 A | 6/1992 | Boardman et al. | 437/195 |
| 5,138,412 A | 8/1992 | Hieda et al. | 357/23.6 |
| 5,168,073 A | 12/1992 | Gonzalez et al. | 437/47 |
| 5,206,183 A | 4/1993 | Dennison | 437/47 |
| 5,250,457 A | 10/1993 | Dennison | 437/48 |
| 5,990,021 A * | 11/1999 | Prall et al. | 438/753 X |
| 6,054,394 A * | 4/2000 | Wang | 438/753 |
| 6,200,898 B1 * | 3/2001 | Tu | 438/692 |
| 6,232,240 B1 * | 5/2001 | Tung | 438/745 |
| 6,258,729 B1 * | 7/2001 | DeBoer et al. | 438/745 |

FOREIGN PATENT DOCUMENTS

| | | |
|---|---|---|
| DE | 42 20 497 A1 | 6/1992 |
| DE | 43 16 503 A1 | 5/1993 |
| JP | 2528608 | 8/1996 |

OTHER PUBLICATIONS

IBM Corp., Stacked Capacitor DRAM Cell With Vertical Fins (VF–STC), 33 IBM Technical Disclosure Bulletin, No. 2, pp. 245–247 (Jul. 1990).
Toru Kaga et al., Crown–Shaped Stacked–Capacitor Cell for 1.5–V Operation 64–Mb DRAMS's, 38 IEEE Transactions on Electron Devices, No. 2, pp. 255–260 (Feb. 1991).
K. Ueno et al., A Quater–Micron Planarized Interconnection Technology With Self–Aligned Plug, IEEE, pp. 305–308 (1992).

* cited by examiner

Primary Examiner—William A. Powell
(74) Attorney, Agent, or Firm—Wells St. John P.S.

(57) ABSTRACT

The invention includes methods of forming memory circuitry, including methods of forming memory circuitry comprising a buried bit line array of memory cells. In one implementation, a method of forming memory circuitry comprising a buried bit line array of memory cells includes, in a single planarizing step, planarizing storage node contact opening plugging material and bit line trench plugging material to insulating material to form bit lines and storage node contacts which are electrically isolated laterally from one another by the insulating material. In one implementation, a method of forming memory circuitry comprising a buried bit line array of memory cells, includes forming word lines over a semiconductor substrate. An insulating layer is formed over the substrate and over the word lines. Using a single photomasking step, bit line contact openings and capacitor storage node contact openings are patterned and formed into the insulating layer. After forming the bit line contact openings and the storage node contact openings, bit line trenches are formed into the insulating layer and which overlie and connect with the bit line contact openings.

45 Claims, 13 Drawing Sheets

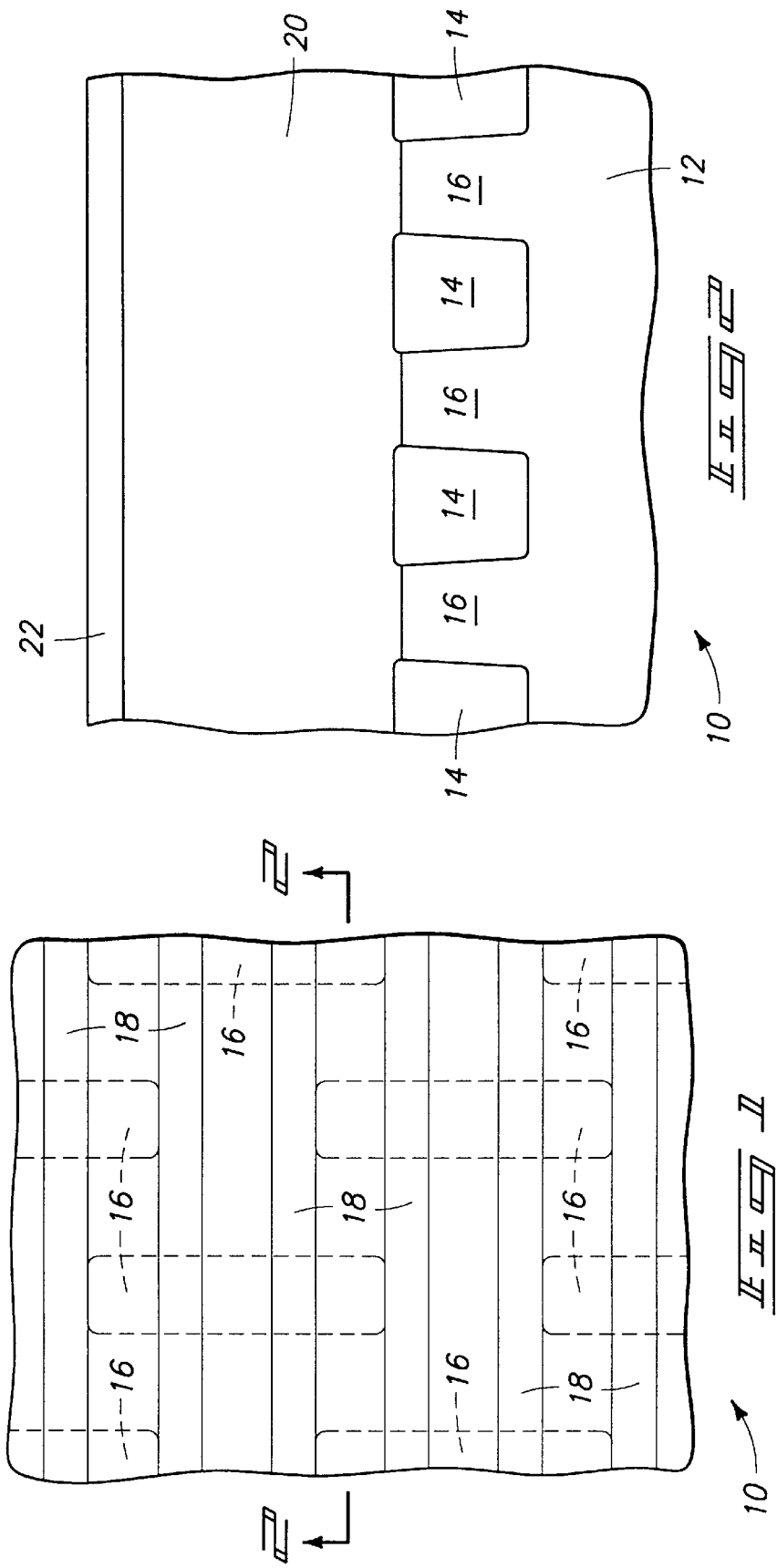

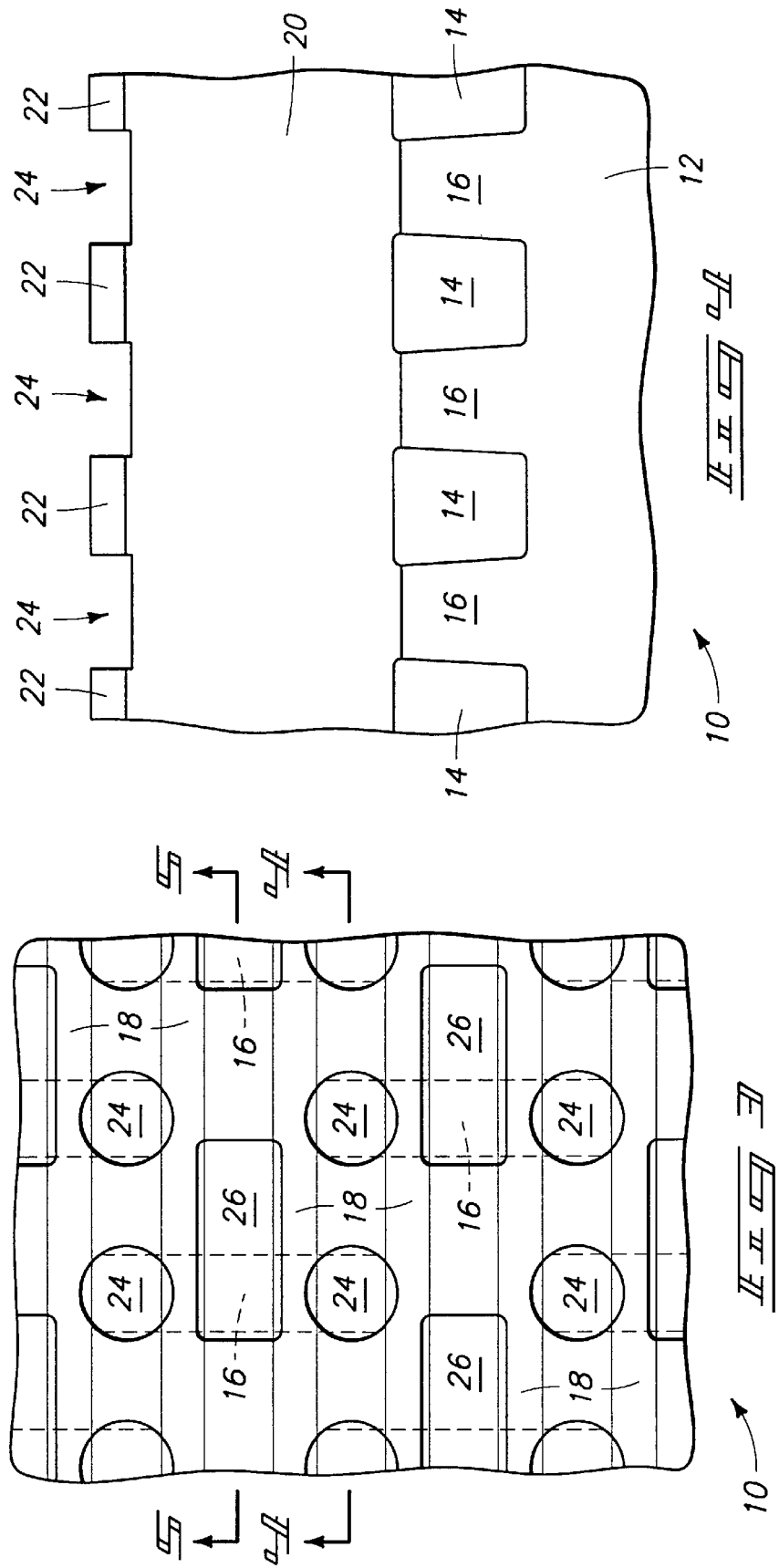

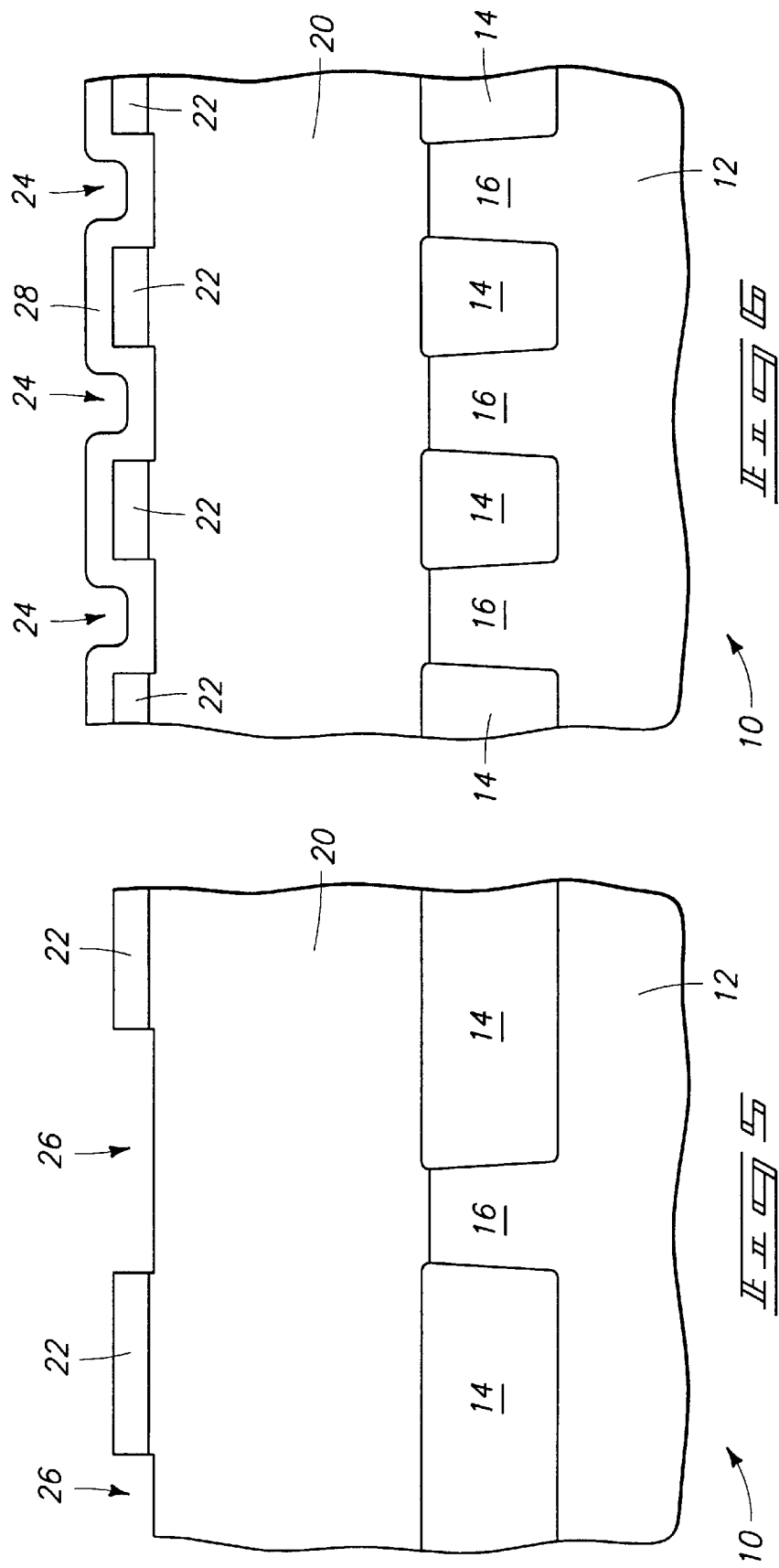

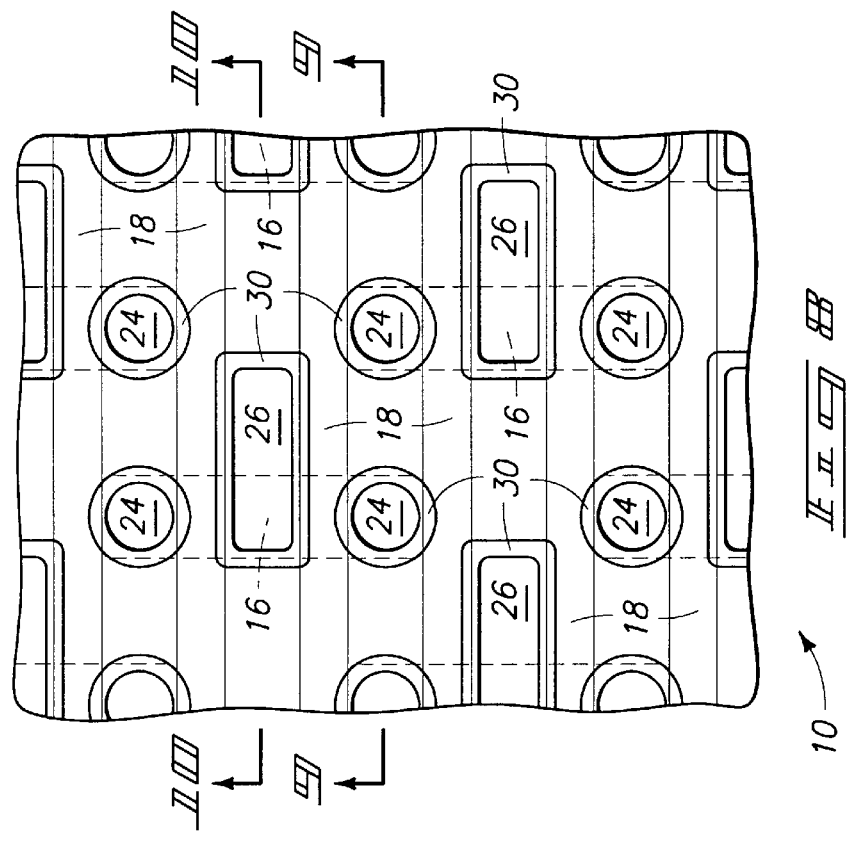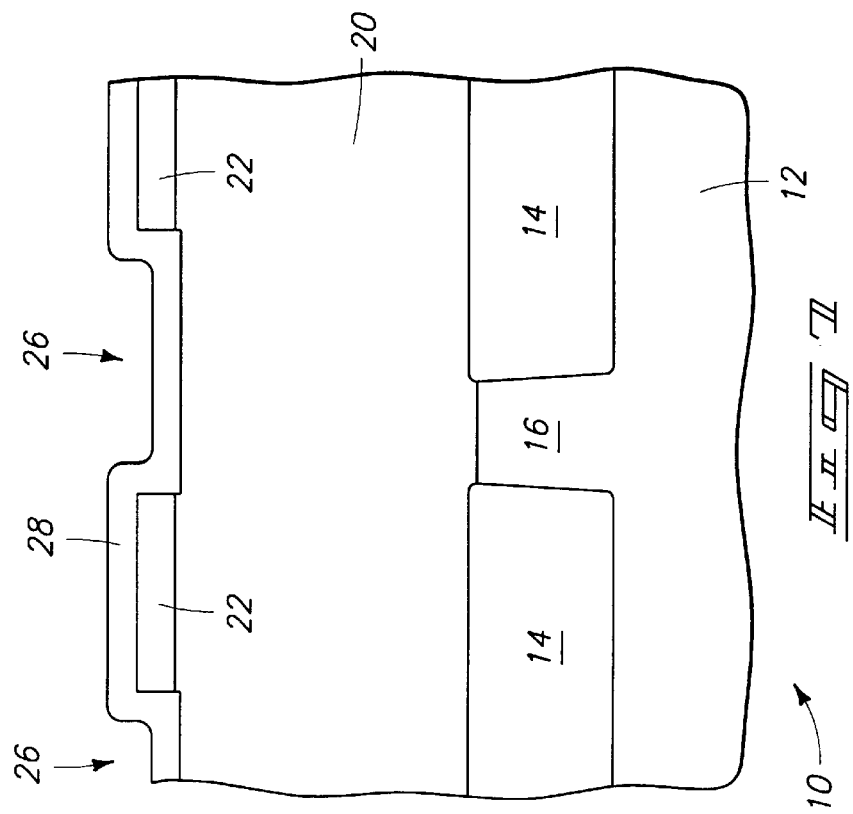

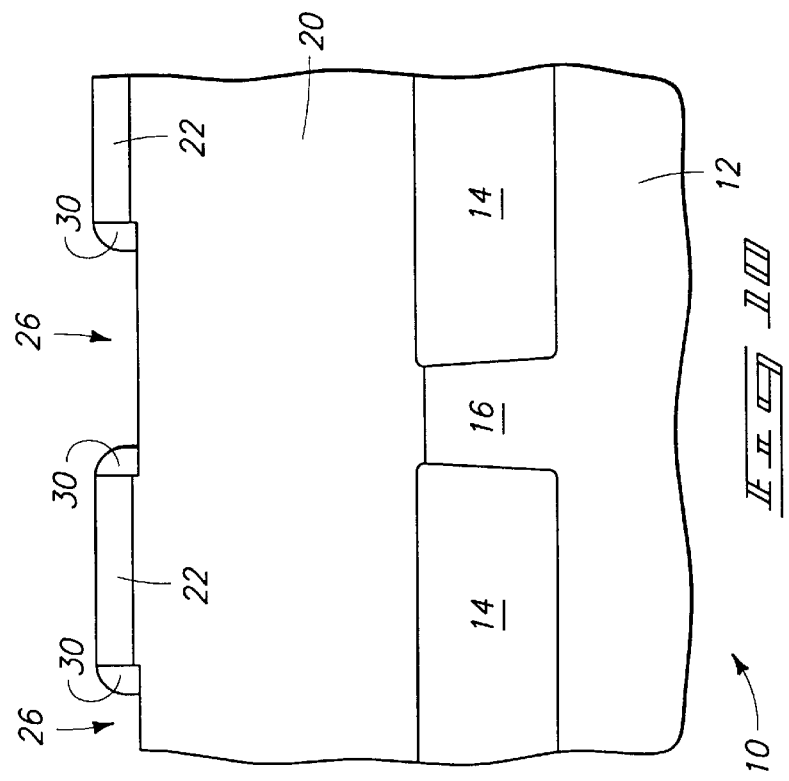
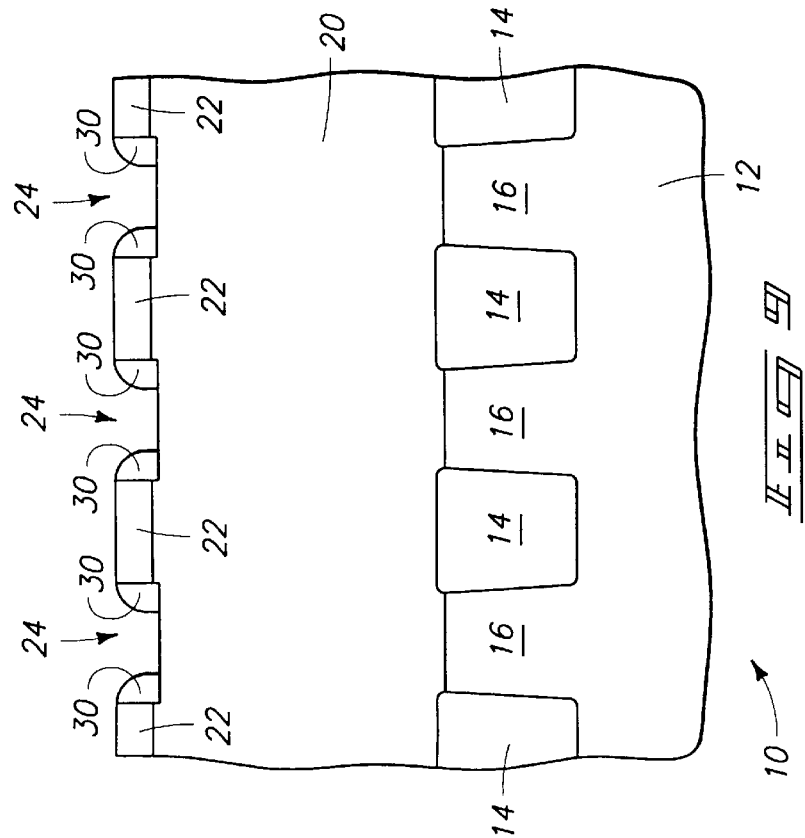

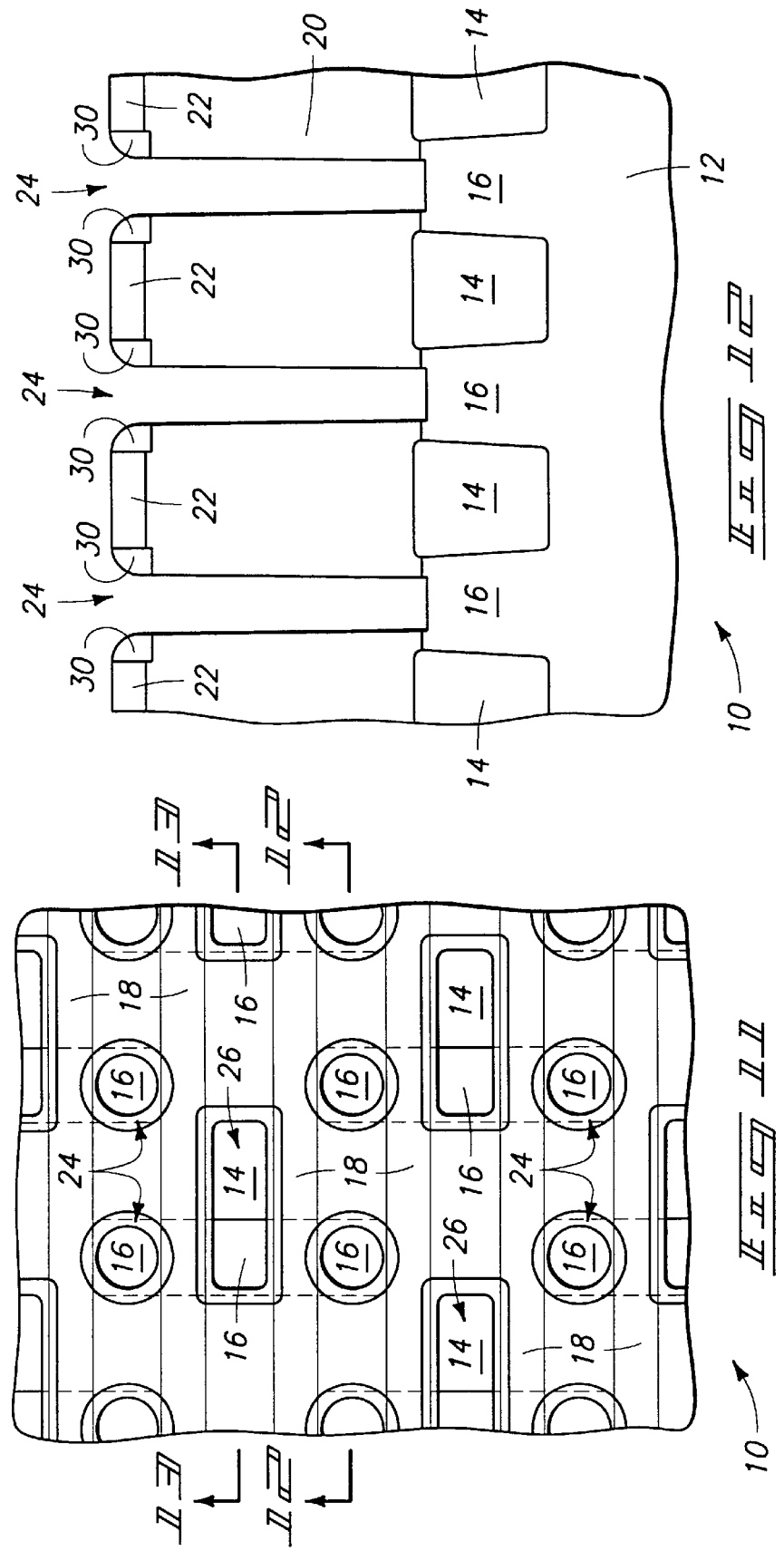

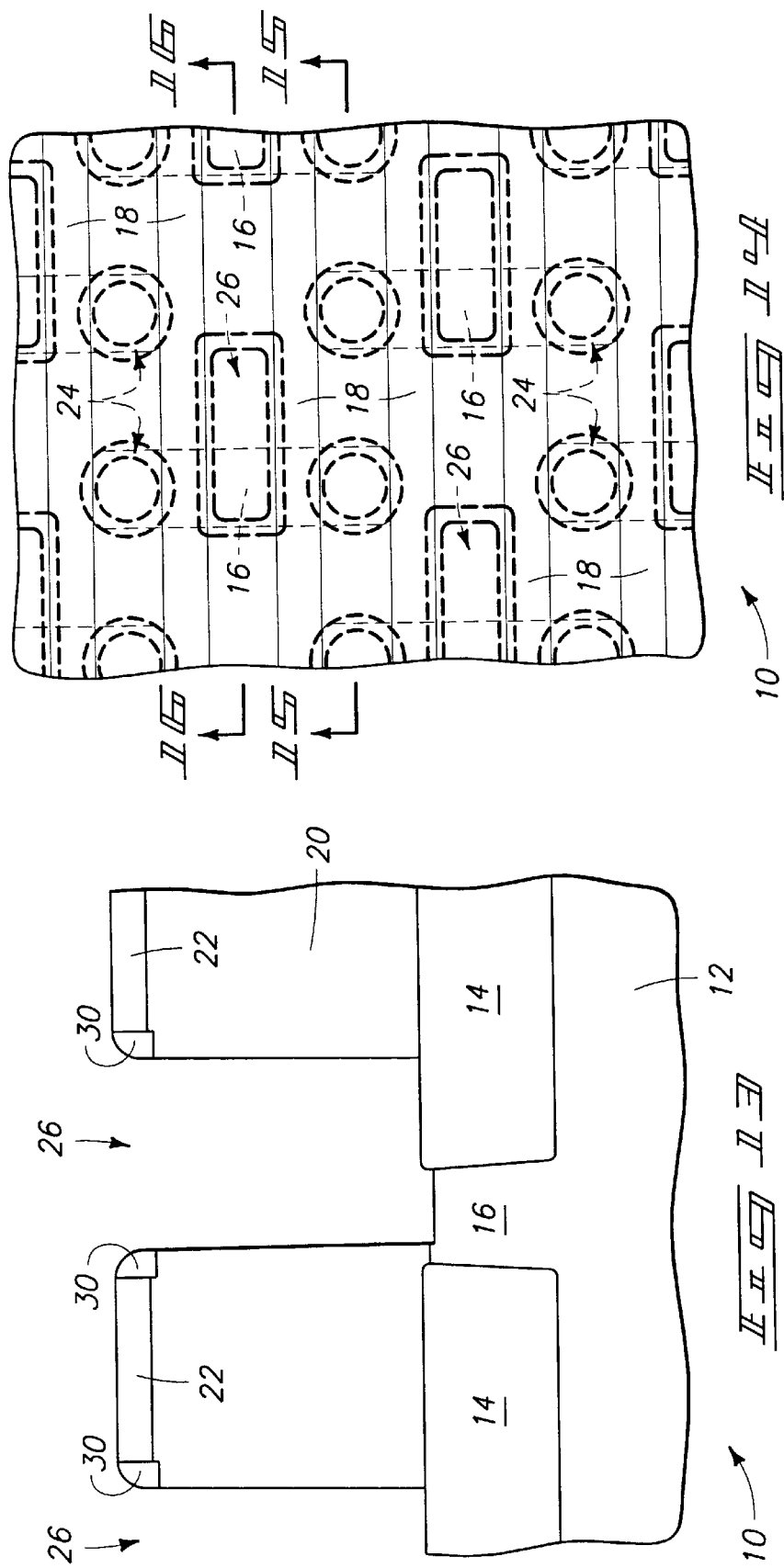

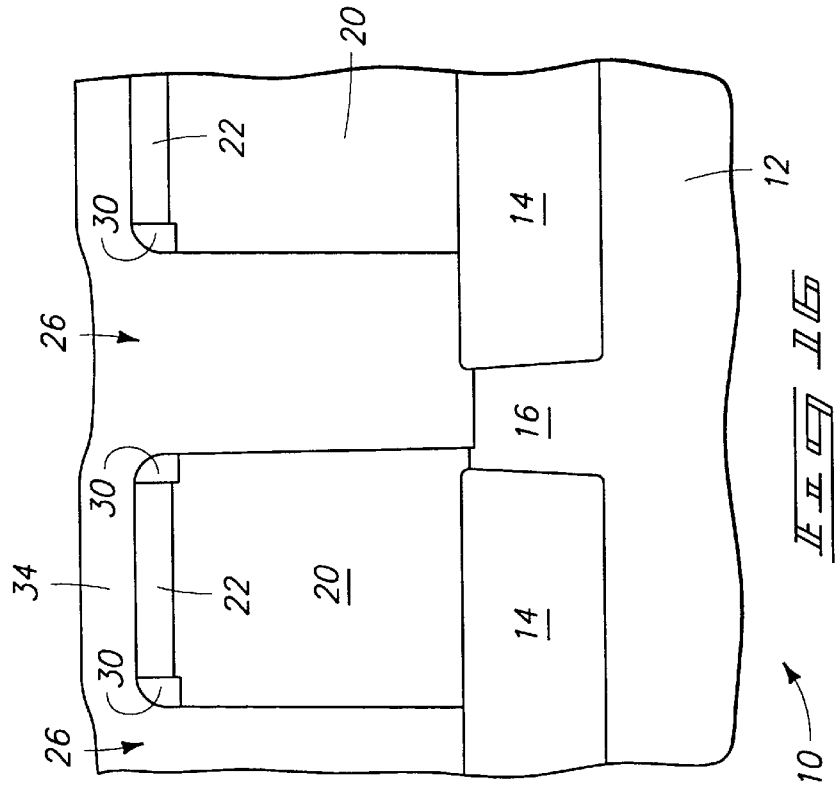
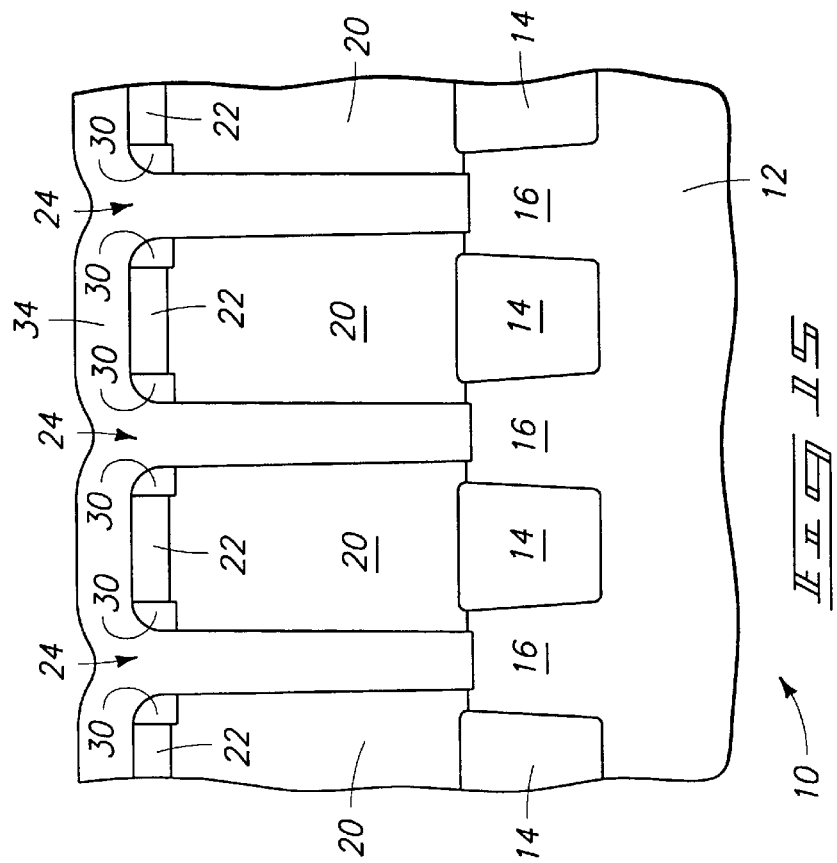

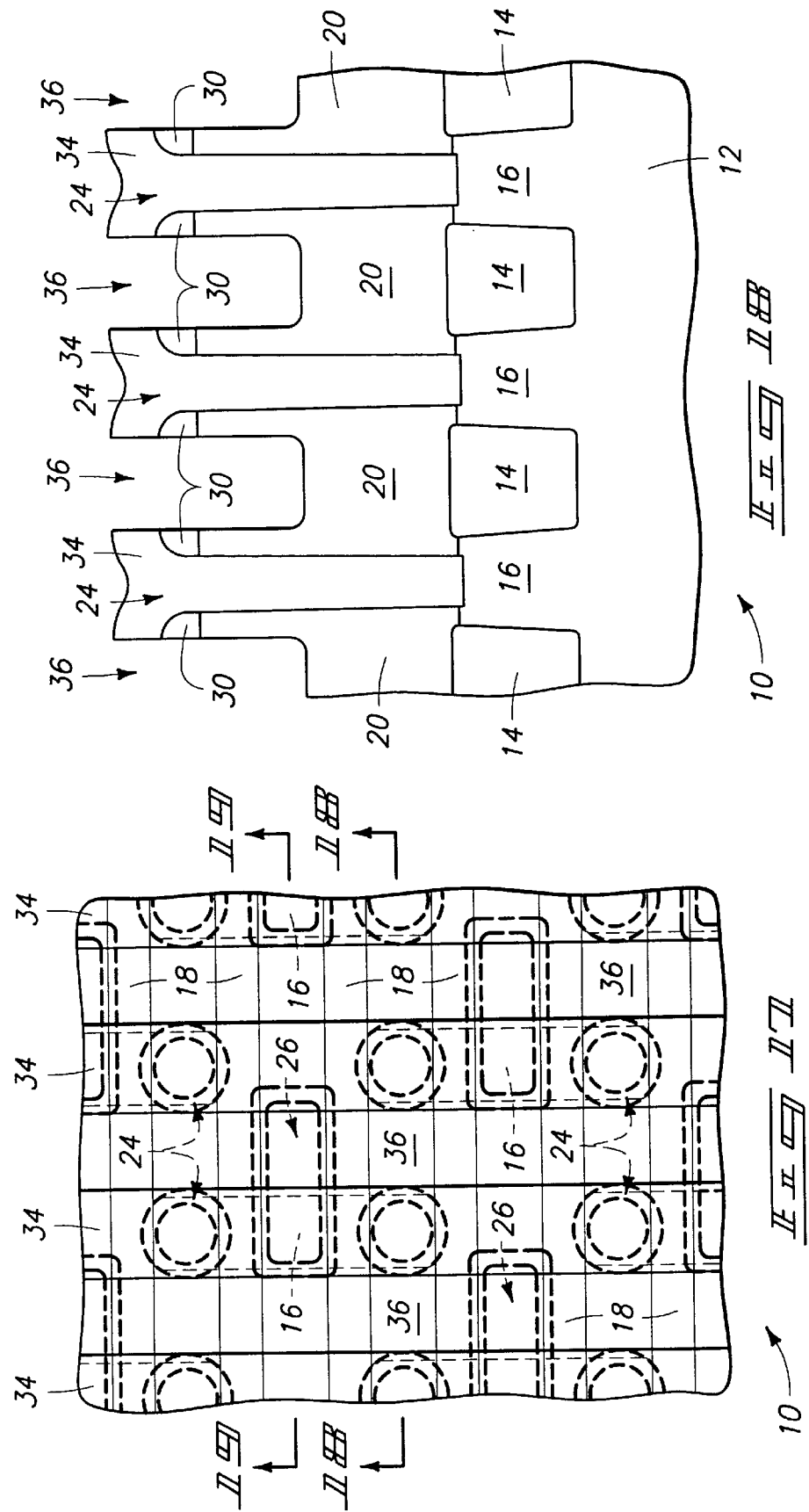

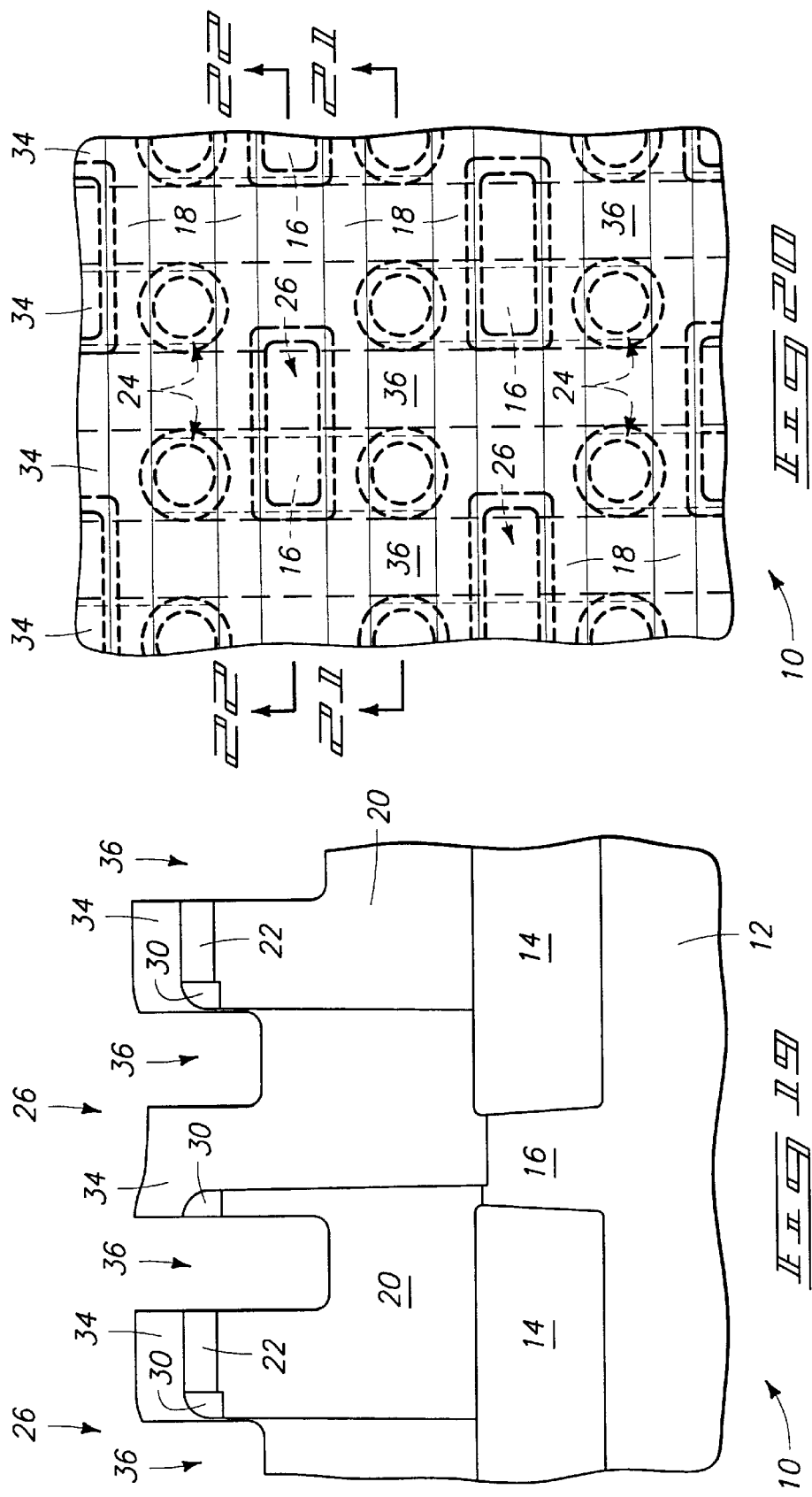

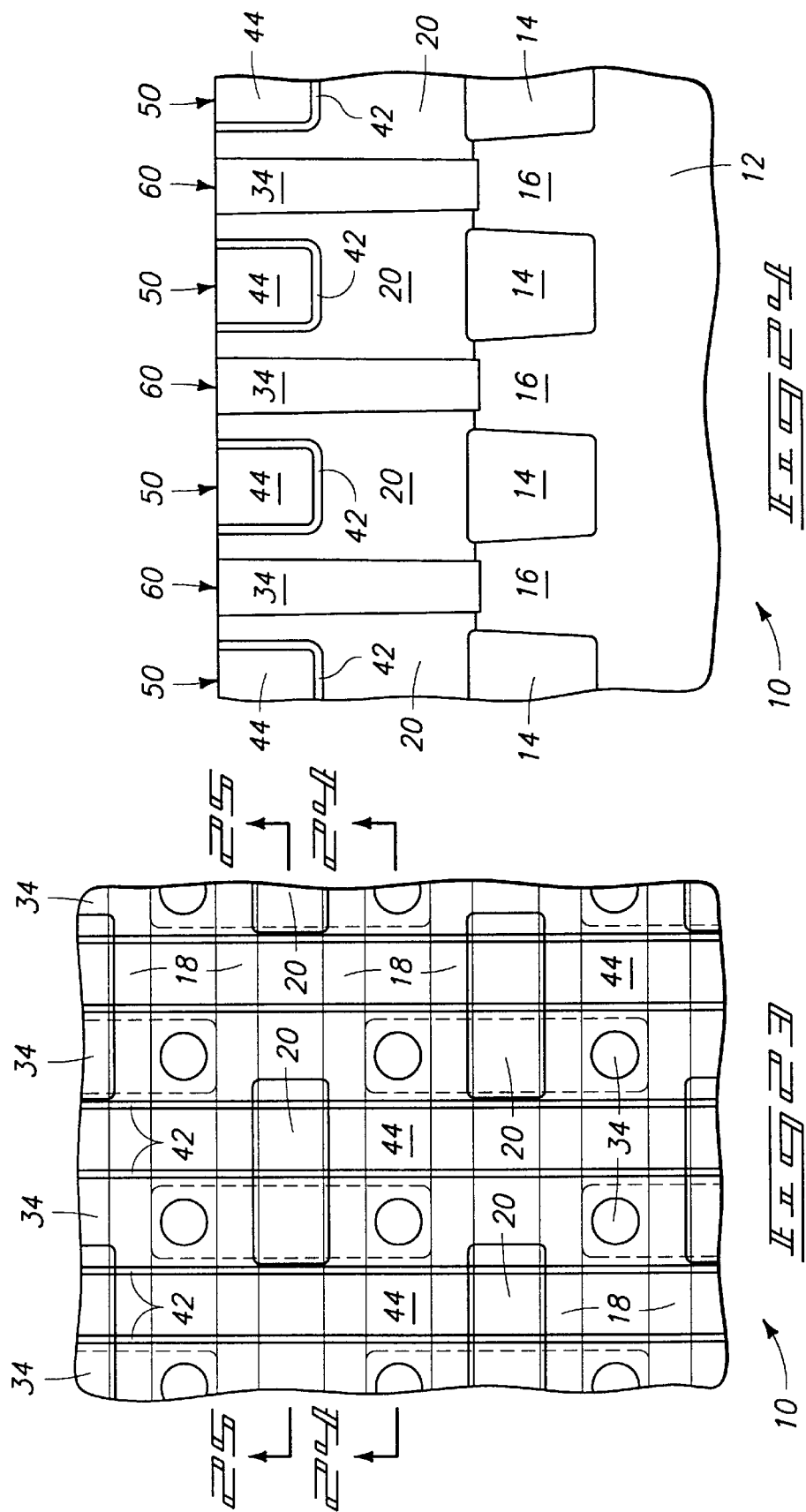

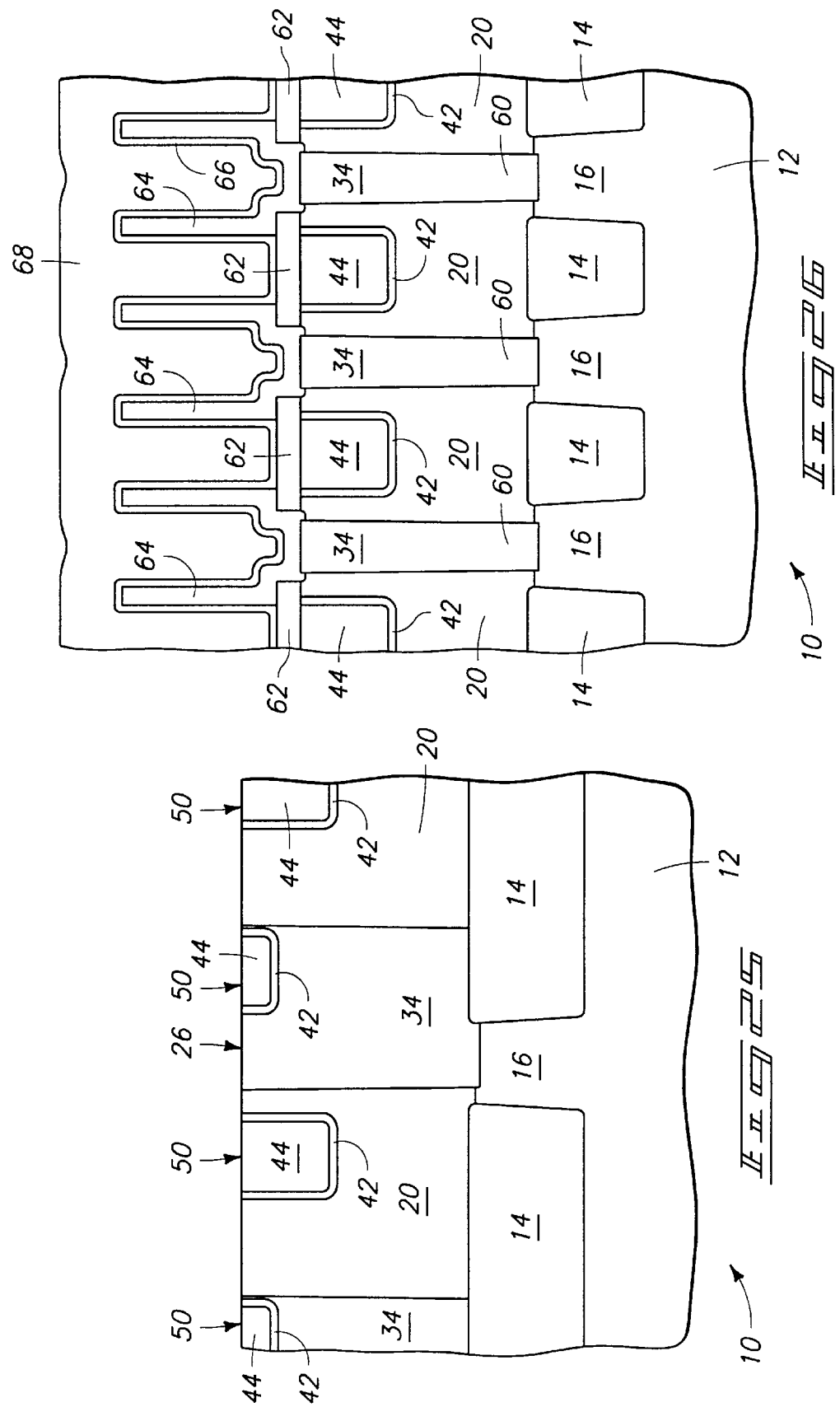

METHOD OF FORMING MEMORY CIRCUITRY AND METHOD OF FORMING MEMORY CIRCUITRY COMPRISING A BURIED BIT LINE ARRAY OF MEMORY CELLS

TECHNICAL FIELD

This invention relates generally to methods of forming memory circuitry, for example memory circuitry comprising a buried bit line array of memory cells.

BACKGROUND OF THE INVENTION

Conventional dynamic random access memory (DRAM) fabrication utilizes either a buried bit line or a non-buried bit line construction. With buried bit line constructions, bit lines are provided in elevational close proximity to the bit line contacts of the memory cell field effect transistors (FETs), with the cell capacitors being formed horizontally over the top of the word lines and the bit lines. With non-buried bit line constructions, deep vertical contacts are typically made through a thick insulating layer to the memory cell FETs, with the capacitor constructions being provided over the word lines and beneath the bit lines.

While this invention was principally motivated in fabricating buried bit line constructions and associated with DRAM, aspects of the invention are applicable to fabrication of other memory circuitry.

SUMMARY

The invention includes methods of forming memory circuitry, including methods of forming memory circuitry comprising a buried bit line array of memory cells. In one implementation, a method of forming memory circuitry comprising a buried bit line array of memory cells includes, in a single planarizing step, planarizing storage node contact opening plugging material and bit line trench plugging material to insulating material to form bit lines and storage node contacts which are electrically isolated laterally from one another by the insulating material.

In one implementation, a method of forming memory circuitry comprising a buried bit line array of memory cells, includes forming word lines over a semiconductor substrate. An insulating layer is formed over the substrate and over the word lines. Using a single photomasking step, bit line contact openings and capacitor storage node contact openings are patterned and formed into the insulating layer. After forming the bit line contact openings and the storage node contact openings, bit line trenches are formed into the insulating layer and which overlie and connect with the bit line contact openings.

Other aspects are contemplated.

BRIEF DESCRIPTION OF THE DRAWINGS

Preferred embodiments of the invention are described below with reference to the following accompanying drawings.

FIG. 1 is a diagrammatic top plan view of a portion of a semiconductor wafer fragment at one processing step in accordance with an aspect of the invention.

FIG. 2 is a diagrammatic sectional view taken through line 2—2 in FIG. 1.

FIG. 3 is a diagrammatic top plan view at a processing step subsequent to that depicted by FIG. 1.

FIG. 4 is a diagrammatic sectional view taken through line 4—4 in FIG. 3.

FIG. 5 is a diagrammatic sectional view taken through line 5—5 in FIG. 3.

FIG. 6 is a diagrammatic sectional view positionally corresponding to that of FIG. 4 at a processing step subsequent to that of FIG. 4.

FIG. 7 is a diagrammatic sectional view positionally corresponding to that of FIG. 5 at a processing step subsequent to that of FIG. 5 and corresponding in sequence to that of FIG. 6.

FIG. 8 is a diagrammatic top plan view at a processing step subsequent to those depicted by FIGS. 3, 6 and 7.

FIG. 9 is a diagrammatic sectional view taken through line 9—9 in FIG. 8.

FIG. 10 is a diagrammatic sectional view taken through line 10—10 in FIG. 8.

FIG. 11 is a diagrammatic top plan view at a processing step subsequent to that depicted by FIG. 8.

FIG. 12 is a diagrammatic sectional view taken through line 12—12 in FIG. 11.

FIG. 13 is a diagrammatic sectional view taken through line 13—13 in FIG. 11.

FIG. 14 is a diagrammatic top plan view at a processing step subsequent to that depicted by FIG. 11.

FIG. 15 is a diagrammatic sectional view taken through line 15—15 in FIG. 14.

FIG. 16 is a diagrammatic sectional view taken through line 16—6 in FIG. 14.

FIG. 17 is a diagrammatic top plan view at a processing step subsequent to that depicted by FIG. 14.

FIG. 18 is a diagrammatic sectional view taken through line 18—18 in FIG. 17.

FIG. 19 is a diagrammatic sectional view taken through line 19—19 in FIG. 17.

FIG. 20 is a diagrammatic top plan view at a processing step subsequent to that depicted by FIG. 17.

FIG. 23 is a diagrammatic top plan view at a processing step subsequent to that depicted by FIG. 20.

FIG. 24 is a diagrammatic sectional view taken through line 24—24 in FIG. 23.

FIG. 25 is a diagrammatic sectional view taken through line 25—25 in FIG. 23.

FIG. 26 is a diagrammatic sectional view positionally corresponding to that of FIG. 24 at a processing step subsequent to that of FIG. 24.

DETAILED DESCRIPTION OF THE PREFERRED EMBODIMENTS

Figure 22:
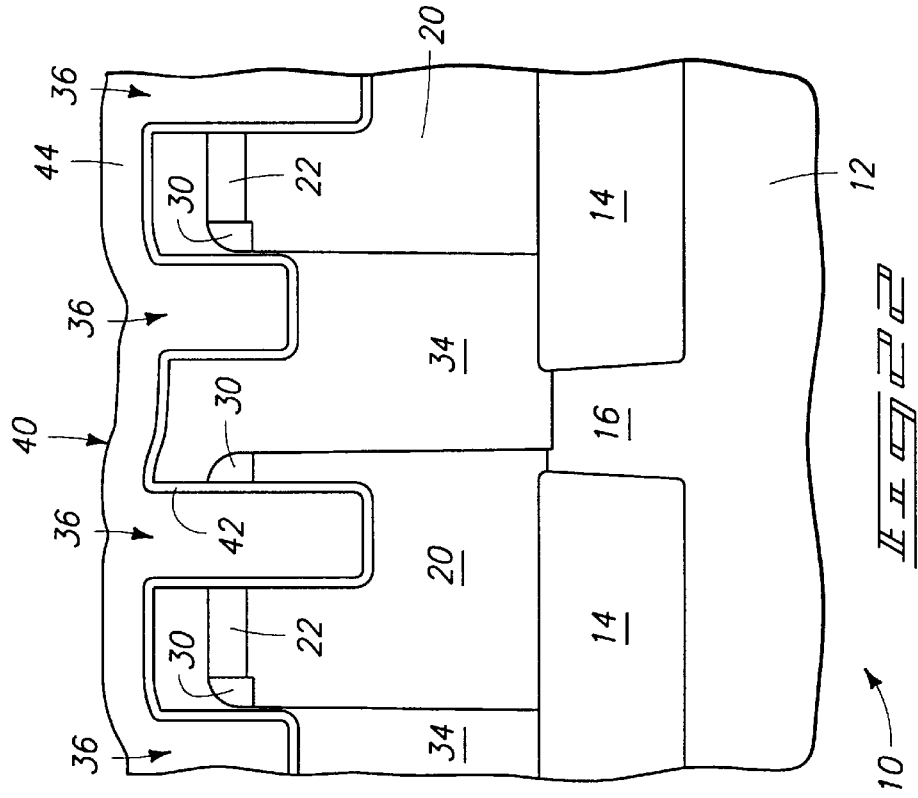
FIG. 22 is a diagrammatic sectional view taken through line 22—22 in FIG. 20.

This disclosure of the invention is submitted in furtherance of the constitutional purposes of the U.S. Patent Laws "to promote the progress of science and useful arts" (Article 1, Section 8).

Referring initially to FIGS. 1 and 2, a semiconductor wafer fragment in process is indicated generally with reference 10. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Further in the context of this document, the term "layer" encompasses both the singular and the plural.

Wafer fragment 10 comprises of bulk monocrystalline silicon substrate 12 having shallow trench isolation regions 14 and active area regions 16 formed therein. A series of word lines 18 (FIG. 1) is formed over semiconductor substrate 12. An insulating layer 20 is formed over substrate 12 and word lines 18. Such preferably has a substantially planar outer surface, as shown. An exemplary preferred material for layer 20 is borophosphosilicate glass (BPSG) provided to an ultimate thickness of preferably from about 8,000 Angstroms to 9,000 Angstroms.

A first masking layer 22 of a first material is formed over substantially planer insulating layer 20. An exemplary preferred material is undoped polysilicon deposited to an exemplary thickness of 1,000 Angstroms.

Referring to FIGS. 3–5, capacitor storage node contact openings 24 are patterned and formed within first masking layer 22. Bit line contact openings are patterned and formed within masking layer 22. Most preferably, such are created using photolithography in a single photomasking step, whereby such are formed at the same time with one mask.

Referring to FIGS. 6 and 7, a second masking layer 28 is formed over first masking layer 22 to less than completely fill bit line contact openings 26 and storage node contact openings 24 in first masking layer 22. The first and second masking layers can comprise different materials. For example, each could be respectively singularly homogenous, and collectively comprised of two different materials. The first and second masking layers could also be individually comprised of multiple layers whereby at least some of the layers are different between the first and second masking layers. Further in such instance, the first and second masking layers might not comprise any material which is common to both. Further, the first and second masking layers can comprise the same material where multiple layers are used for each. Further by way of example only, the first and second masking layers might consist of a respective single homogenous layer consisting essentially of the same material. Preferably, the first and second masking layer comprise a respective single homogenous layer of the same material, for example, each preferably consisting essentially of doped or undoped polysilicon.

Referring to FIGS. 8–10, second masking layer 28 is anisotropically etched to form masking spacers 30 within both bit line contact openings 24 and storage node contact openings 26 within first masking layer 22 to effectively reduce their respective sizes. Most preferably, the memory circuitry being fabricated has some minimum photolithographic feature dimension used to fabricate the circuitry. Each of the bit line contact openings and the storage node contact openings are preferably formed to have at least one cross dimension which is less than the minimum photolithographic feature dimension, preferably by using the technique just described.

For example, FIG. 3 illustrates the initial preferred oversized storage node contacts as being substantially circular. Where such oversized storage node contacts were patterned at the minimum photolithographic feature size used anywhere to fabricate the circuitry, the results in storage node contact openings 24 of FIG. 8 will thereby have the substantially circular shape having a diameter which effectively constitutes at least one cross dimension which is less than the minimum photolithographic feature dimension. Likewise looking at FIG. 3, oversized bit line contact openings 26 are shown as being rectangularly elongated. Where, for example, the vertical dimension as appearing on the page upon which FIG. 3 lies for such bit line contact opening were fabricated to be of the minimum photolithographic feature size, the results in same one cross dimension in a vertical line in FIG. 8 will be less than the minimum photolithographic feature dimension. Accordingly, the thickness of second masking layer 28 controls the critical open cross dimension of the respective openings. By way of example only, a preferred minimum cross dimension opening in FIG. 8 at the time of this writing is from about 500 Angstroms to about 1,000 Angstroms.

Referring to FIGS. 11–13, bit line contact openings 26 and capacitor storage node contact openings 24 of the reduced sizes are extended and etched into insulating layer 20 using first masking layer 22 and masking spacers 30 as a mask. The invention also of course contemplates fabrication without masking spacers 30 and in the fabrication storage node contact openings without fabrication of bit line contact openings, with the invention only being limited by the accompanying claims appropriately interpreted in accordance with the doctrine of equivalence. The described and illustrated example provides but one technique whereby using a single photomasking step, bit line contact openings and capacitor storage node contact openings are patterned and formed into insulating layer 20.

Referring to FIGS. 14–16, a first conductive layer 34 is deposited to overfill both reduced sized bit line contact openings 26 and reduced sized storage node contact openings 24 in insulating layer 20. An example and preferred material for layer 34 is conductively doped polysilicon. Accordingly in one aspect, the invention contemplates forming at least one of the first and second masking layers to comprise polysilicon, and preferably both to comprise polysilicon, and the first conductive layer to comprise polysilicon.

Referring to FIGS. 17–19, masking and etching is conducted through first conductive layer 34 and into insulating layer 20 to form bit line trenches 36 in first conductive layer 34, in insulating layer 20 and over bit line contact openings 26. Accordingly, bit line trenches 36 in insulating layer 20 overlie and connect with bit line contact openings 26 in insulating layer 20. Such is preferably conducted using conventional or yet-to-be-developed chemistries which first etch polysilicon substantially selective to BPSG and thereafter in a timed etched BPSG substantially selective to polysilicon.

Figure 21:
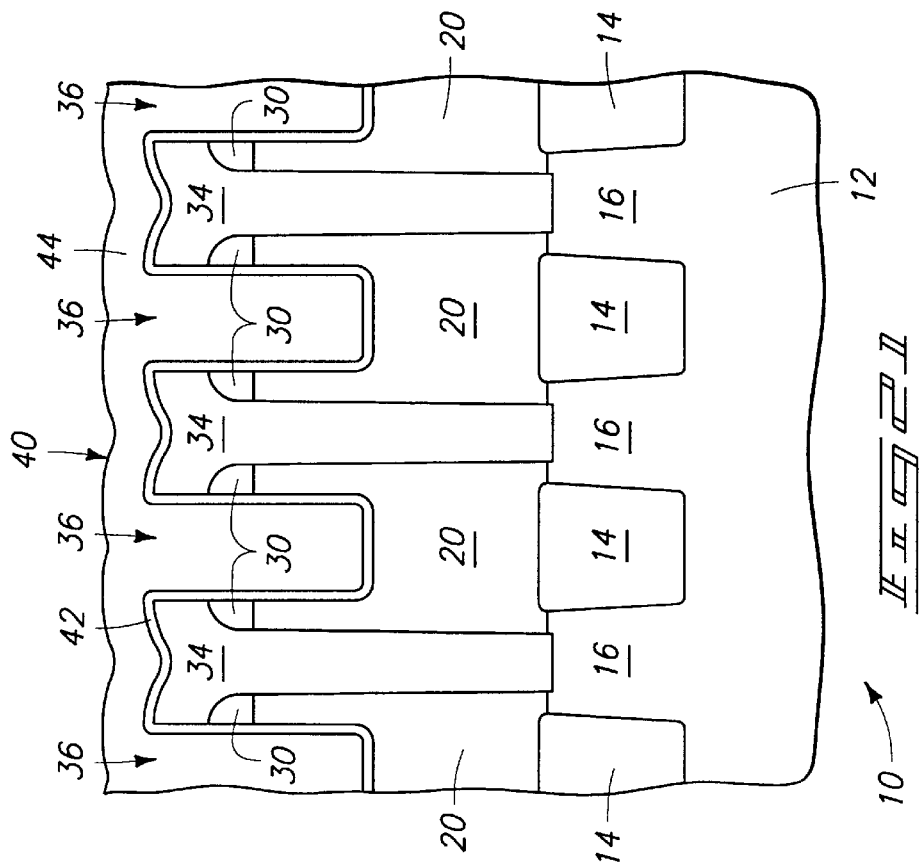
FIG. 21 is a diagrammatic sectional view taken through line 21—21 in FIG. 20.

Referring to FIGS. 20–22, a second conductive layer 40 is deposited to overfill bit line trenches 36 and overlie first conductive material 34, and in the illustrated and preferred embodiment be received contacting on and electrically connecting with first conductive layer 34. Preferably, second conductive layer 40 comprises an exemplary first tungsten nitride barrier layer 42 and an overlying tungsten layer 44 which completely fills and overfills trenches 36. Accordingly in this example, the first and second conductive layers comprise different materials, and as well do not comprise any material common to both. Alternately but less preferred, the first and second conductive layers could comprise the same material, or could consist of essentially of the same material.

Referring to FIGS. 23–25 in at least one common planarizing step, and preferably in a single planarizing step, second conductive layer 44, first conductive layer 34 and the masking layers are planarized at least to the top of insulating layer 20 to form bit lines 50 and storage node contacts 60 which are electrically isolated laterally from one another by insulating material 20. Planarizing might occur by chemical-mechanical polishing, resist etch back, or other existing or yet-to-be-developed planarizing methods. Chemical-mechanical polishing with a predominately potassium hydroxide slurry is most preferred.

Referring to FIG. 26, subsequent processing is depicted for formation of capacitors. As shown, an initial insulating layer 62 is deposited and patterned to form openings therethrough over storage node plugs 60. An example preferred material for layer 62 is undoped silicon dioxide deposited for example by decomposition of tetraethylorthosilicate. An exemplary thickness for layer 62 is from about 500 Angstroms to about 1000 Angstroms. Exemplary capacitor storage node containers 64 are shown formed thereover, in conjunction with a capacitor dielectric layer 66 and an overlying cell node layer 68.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming memory circuitry comprising a buried bit line array of memory cells, comprising:
   forming word lines over a semiconductor substrate;
   forming an insulating layer over the substrate and over the word lines;
   using a single photomasking step, patterning and forming bit line contact openings and capacitor storage node contact openings into the insulating layer; and
   after forming the bit line contact openings and the storage node contact openings, forming bit line trenches into the insulating layer which overlie and connect with the bit line contact openings.

2. The method of claim 1 comprising forming the insulating layer to be substantially planar prior to the photomasking step.

3. The method of claim 1 comprising depositing conductive material over the insulating material to overfill the bit line contact openings and the capacitor storage node contact openings prior to forming the trenches, and forming the bit line trenches though the conductive material over the insulating layer.

4. The method of claim 1 wherein the memory circuitry is fabricated to have a minimum photolithographic feature dimension, each of the bit line contact openings and the storage node contact openings being formed to have at least one cross dimension which is less than the minimum photolithographic feature dimension.

5. A method of forming memory circuitry comprising a buried bit line array of memory cells, the method comprising in a single planarizing step, planarizing storage node contact opening plugging material and bit line trench plugging material to insulating material to form bit lines and storage node contacts which are electrically isolated laterally from one another by the insulating material.

6. The method of claim 5 wherein the insulating material is substantially planar prior to the planarizing.

7. The method of claim 5 wherein the storage node contact opening plugging material and the bit line trench plugging material are of different composition from one another.

8. The method of claim 5 wherein the planarizing comprises chemical mechanical polishing.

9. The method of claim 5 wherein the planarizing comprises resist etch back.

10. A method of forming memory circuitry comprising a buried bit line array of memory cells, comprising:
    forming word lines over a semiconductor substrate;
    forming an insulating layer over the substrate and over the word lines;
    forming storage node contact openings into the insulating layer;
    depositing a first conductive layer over the insulating layer to overfill the storage node contact openings;
    etching through the first conductive layer and into the insulating layer to form bit line trenches in the first conductive layer and in the insulating layer;
    depositing a second conductive layer to overfill the bit line trenches and overlie the first conductive layer; and
    in at least one common planarizing step, planarizing both the first conductive layer and the second conductive layer to the insulating layer.

11. The method of claim 10 wherein the first and second conductive layers comprise different materials.

12. The method of claim 10 wherein the first and second conductive layers do not comprise any material common to both.

13. The method of claim 10 wherein the second conductive layer is deposited on the first conductive layer.

14. The method of claim 10 wherein the memory circuitry is fabricated to have a minimum photolithographic feature dimension, the storage node contact openings being formed to have at least one cross dimension which is less than the minimum photolithographic feature dimension.

15. The method of claim 10 comprising forming the insulating layer to be substantially planar prior to depositing the first conductive layer.

16. A method of forming memory circuitry comprising a buried bit line array of memory cells, comprising:
    forming word lines over a semiconductor substrate;
    forming an insulating layer over the substrate and over the word lines;
    forming storage node contact openings and bit line contact openings into the insulating layer;
    depositing a first conductive layer over the insulating layer to overfill both the storage node contact openings and the bit line contact openings;
    etching through the first conductive layer and into the insulating layer to form bit line trenches in the first conductive layer, in the insulating layer and aligned over the bit line contact openings;
    depositing a second conductive layer to overfill the bit line trenches and overlie the first conductive layer; and
    in at least one common planarizing step, planarizing both the first conductive layer and the second conductive layer to the insulating layer.

17. The method of claim 16 wherein the memory circuitry is fabricated to have a minimum photolithographic feature dimension, the storage node contact openings and the bit line contact openings being formed to have at least one cross dimension which is less than the minimum photolithographic feature dimension.

18. The method of claim 16 comprising forming the insulating layer to be substantially planar prior to depositing the first conductive layer.

19. The method of claim 16 wherein the first and second conductive layers comprise different materials.

20. The method of claim 16 wherein the first and second conductive layers do not comprise any material common to both.

21. The method of claim 16 wherein the second conductive layer is deposited on the first conductive layer.

22. A method of forming memory circuitry comprising:
forming word lines over a semiconductor substrate;
forming an insulating layer over the substrate and over the word lines;
forming a first masking layer over the insulating layer;
using a single photomasking step, patterning and forming bit line contact openings and capacitor storage node contact openings into the first masking layer;
forming a second masking layer over the first masking to less than completely fill the bit line contact openings and the storage node contact openings in the first masking layer;
anisotropically etching the second masking layer to form masking spacers within both the bit line contact openings and the storage node contact openings with the first masking layer to effectively reduce their respective sizes;
etching bit line contact openings and capacitor storage node contact openings of the reduced sizes into the insulating layer using the first masking layer and the masking spacers as a mask; and
after the etching into the insulating layer, depositing a conductive layer to overfill both the reduced size bit line contact openings and the reduced size storage node contact openings in the insulating layer.

23. The method of claim 22 wherein at least one of the first and second masking layers comprises polysilicon, and the first conductive layer comprises polysilicon.

24. The method of claim 22 wherein both the first and second masking layers comprise polysilicon, and the first conductive layer comprises polysilicon.

25. The method of claim 22 comprising forming the insulating layer to be substantially planar prior to forming the first masking layer.

26. The method of claim 22 wherein the memory circuitry is fabricated to have a minimum photolithographic feature dimension, each of the bit line contact openings and the storage node contact openings in the insulating layer being formed to have at least one cross dimension which is less than the minimum photolithographic feature dimension.

27. The method of claim 22 wherein the first and the second masking layers comprise different materials.

28. The method of claim 22 wherein the first and second masking layers do not comprise any material common to both.

29. The method of claim 22 wherein the first and the second masking layers comprise the same material.

30. The method of claim 22 wherein the first and the second masking layers consist essentially of the same material.

31. A method of forming memory circuitry comprising a buried bit line array of memory cells, comprising:
forming word lines over a semiconductor substrate;
forming a substantially planar insulating layer over the substrate and over the word lines;
forming a first masking layer over the insulating layer;
using a single photomasking step, patterning and forming bit line contact openings and capacitor storage node contact openings into the first masking layer;
forming a second masking layer over the first masking layer to less than completely fill the bit line contact openings and the storage node contact openings in the first masking layer;
anisotropically etching the second masking layer to form masking spacers within both the bit line contact openings and the storage node contact openings within the first masking layer to effectively reduce their respective sizes;
etching bit line contact openings and capacitor storage node contact openings of the reduced sizes into the insulating layer using the first masking layer and the masking spacers as a mask;
after the etching into the insulating layer, depositing a first conductive layer to overfill both the reduced size bit line contact openings and the reduced size storage node contact openings in the insulating layer;
etching through the first conductive layer and into the insulating layer to form bit line trenches in the first conductive layer, in the insulating layer and aligned over the bit line contact openings;
depositing a second conductive layer to overfill the bit line trenches and overlie and electrically connect with the first conductive layer; and
in at least one common planarizing step, planarizing both the first conductive layer and the second conductive layer to the insulating layer.

32. The method of claim 31 wherein the memory circuitry is fabricated to have a minimum photolithographic feature dimension, each of the bit line contact openings and the storage node contact openings being formed to have at least one cross dimension which is less than the minimum photolithographic feature dimension.

33. The method of claim 31 wherein the first and second conductive layers comprise different materials.

34. The method of claim 31 wherein the first and second conductive layers do not comprise any material common to both.

35. The method of claim 31 wherein the second conductive layer is deposited on the first conductive layer.

36. The method of claim 31 wherein the first and the second masking layers comprise different materials.

37. The method of claim 31 wherein the first and second masking layers do not comprise any material common to both.

38. The method of claim 31 wherein the first and the second masking layers comprise the same material.

39. The method of claim 31 wherein the first and the second masking layers consist essentially of the same material.

40. The method of claim 31 wherein at least one of the first and second masking layers comprises polysilicon, and the first conductive layer comprises polysilicon.

41. The method of claim 31 wherein both the first and second masking layers comprise polysilicon, and the first conductive layer comprises polysilicon.

42. A method of forming memory circuitry comprising a buried bit line array of memory cells, comprising:
forming word lines over a semiconductor substrate;
forming a substantially planar insulating layer over the substrate and over the word lines;
forming a first masking layer of a first material over the insulating layer;
using a single photomasking step, patterning and forming bit line contact openings and capacitor storage node contact openings into the first masking layer;

forming a second masking layer of the first material over the first masking layer to less than completely fill the bit line contact openings and the storage node contact openings in the first masking layer;

anisotropically etching the second masking layer of the first material to form masking spacers within both the bit line contact openings and the storage node contact openings within the first masking layer to effectively reduce their respective sizes;

etching bit line contact openings and capacitor storage node contact openings of the reduced sizes into the insulating layer using the first masking layer and the masking spacers as a mask;

after the etching into the insulating layer, depositing a layer comprising the first material to overfill both the reduced size bit line contact openings and the reduced size storage node contact openings in the insulating layer;

after filling the reduced size bit line contact openings and the reduced size storage node contact openings in the insulating layer, etching through the first material and into the insulating layer to form bit line trenches in the first conductive layer, in the insulating layer and aligned over the bit line contact openings;

depositing a conductive layer of a second material different from the first material to overfill the bit line trenches and on the first material; and in at least one common planarizing step, planarizing both the first material and the second material to the insulating layer to form bit lines and storage node contacts which are electrically isolated from one another by the insulating layer.

43. The method of claim 42 wherein the memory circuitry is fabricated to have a minimum photolithographic feature dimension, each of the bit line contact openings and the storage node contact openings being formed to have at least one cross dimension which is less than the minimum photolithographic feature dimension.

44. The method of claim 42 wherein the first and second conductive layers comprise different materials.

45. The method of claim 42 wherein the first and second conductive layers do not comprise any material common to both.

* * * * *

UNITED STATES PATENT AND TRADEMARK OFFICE
CERTIFICATE OF CORRECTION

PATENT NO.    : 6,376,380 B1
DATED         : April 23, 2002
INVENTOR(S)   : Sanh D. Tang et al.

It is certified that error appears in the above-identified patent and that said Letters Patent is hereby corrected as shown below:

Column 5,
Line 51, replace "line trenches though the conductive" with
-- line trenches through the conductive --

Signed and Sealed this

Eleventh Day of February, 2003

JAMES E. ROGAN
*Director of the United States Patent and Trademark Office*